(12) United States Patent
Mitchell et al.

(10) Patent No.: US 6,646,276 B1
(45) Date of Patent: Nov. 11, 2003

(54) ION IMPLANTATION BEAM MONITOR

(75) Inventors: Robert John Mitchell, Pulborough (GB); Simon Herbert Povall, Ashington (GB); Leslie Lane, Horsham (GB); Amir Hamed Al-Bayati, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/744,013

(22) PCT Filed: Jul. 12, 1999

(86) PCT No.: PCT/GB99/02228

§ 371 (c)(1),
(2), (4) Date: Aug. 2, 2001

(87) PCT Pub. No.: WO00/05744

PCT Pub. Date: Feb. 3, 2000

(30) Foreign Application Priority Data

Jul. 21, 1998 (GB) .............................................. 9815921

(51) Int. Cl.⁷ .............................................. H01J 37/304
(52) U.S. Cl. .................. 250/492.21; 250/398
(58) Field of Search .......................... 250/492.21, 397, 250/398

(56) References Cited

U.S. PATENT DOCUMENTS 4,260,897 A  *  4/1981  Bakker et al. ......... 250/492.21
4,628,209 A     12/1986  Wittkower
4,743,767 A      5/1988  Plumb et al.
5,981,961 A  * 11/1999  Edwards et al. ....... 250/492.21

FOREIGN PATENT DOCUMENTS

| EP | 0 291 279 A1 | 11/1988 |
| EP | 0 534 737 A1 | 3/1993 |
| EP | 0 686 995 A1 | 12/1995 |
| EP | 0 795 888 A2 | 9/1997 |
| WO | WO 84/03943 | 10/1984 |

* cited by examiner

Primary Examiner—Kiet T. Nguyen
(74) Attorney, Agent, or Firm—Boult Wade Tennant and Bach; Joseph Bach

(57) ABSTRACT

As a rotating spoked substrate wheel passes across a beam stop during a scan cycle, a series of pulses are generated by the beam stop. These pulses are analysed to determine characteristics about the ion bam in an implanter.

A digital signal processor (DSP) samples the beam stop current at regular intervals. By comparing the magnitude of successive samples, a dose uniformity map may be generated, so that identification of particular substrates on the wheel which have been dosed incorrectly is possible.

The time taken for the beam to move between two points during the scan can also be measured from the sampled beam stop current. This provides a measurement of ion beam width. Similarly, by measuring, from the sample beam stop current, the time taken for the ion beam to pass between the middle of two adjacent substrates, the beam height may be ascertained.

15 Claims, 8 Drawing Sheets

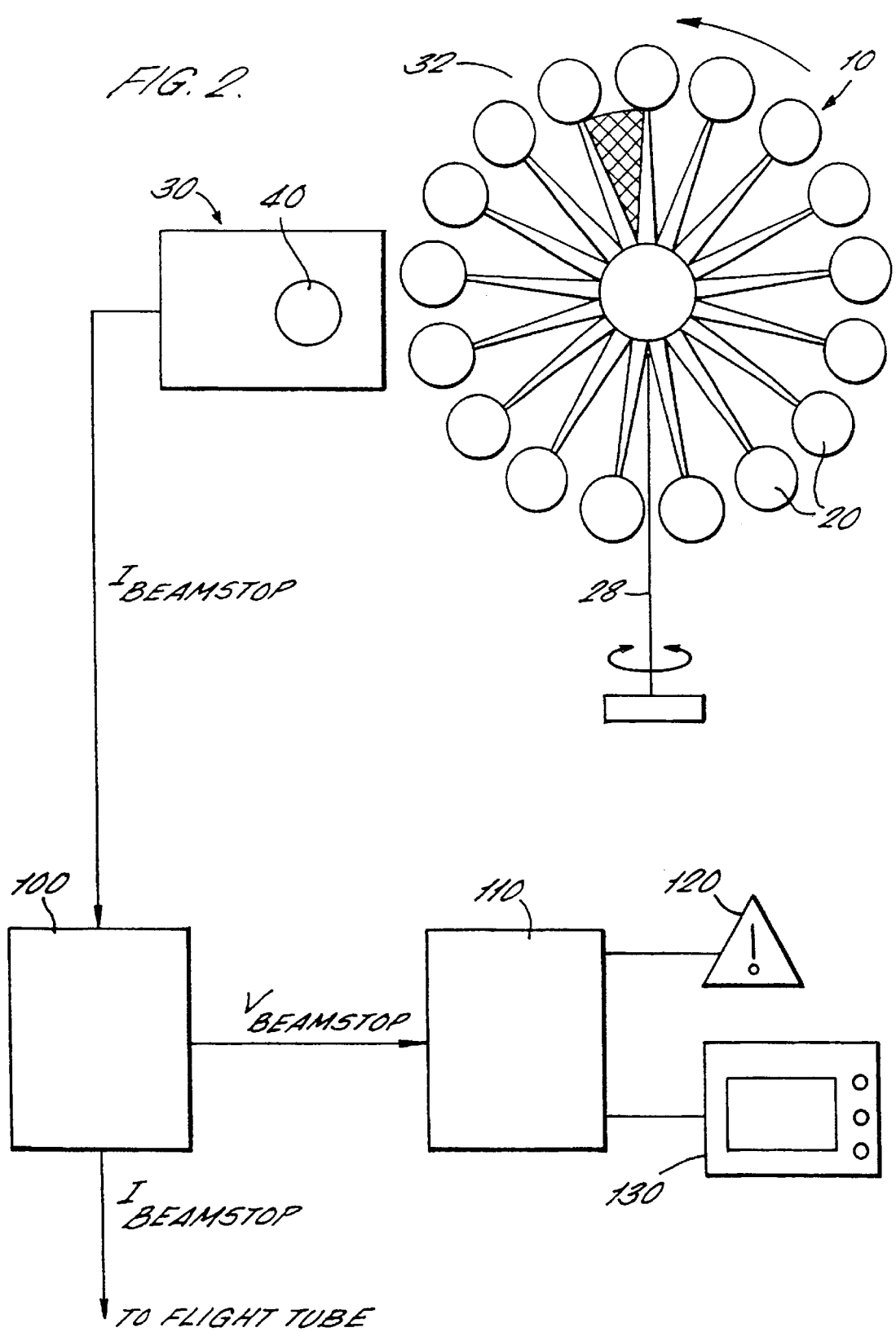

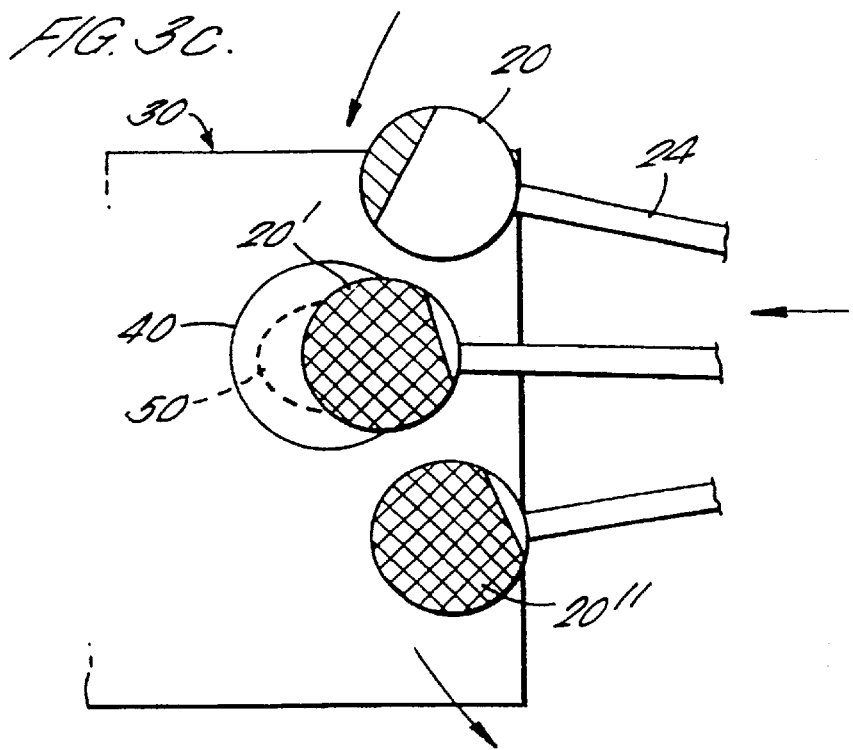
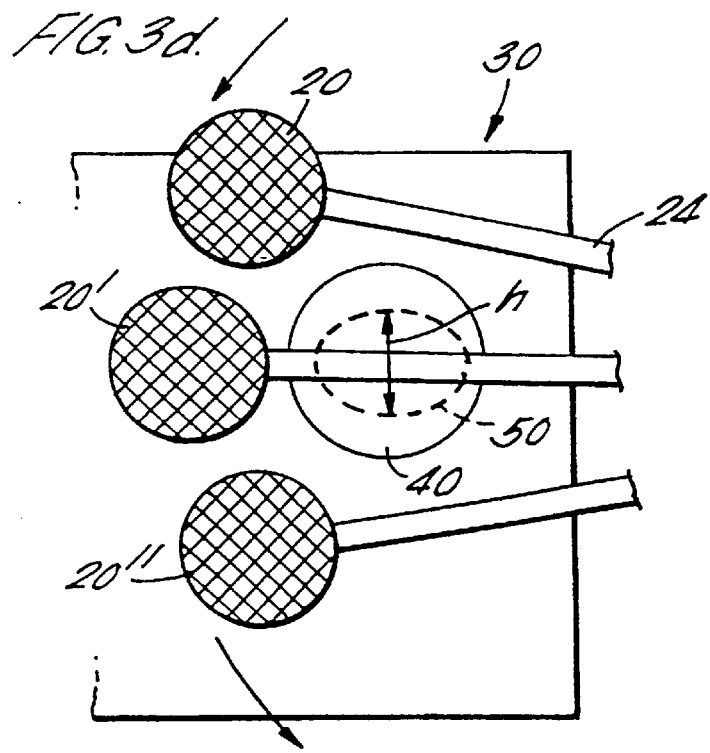

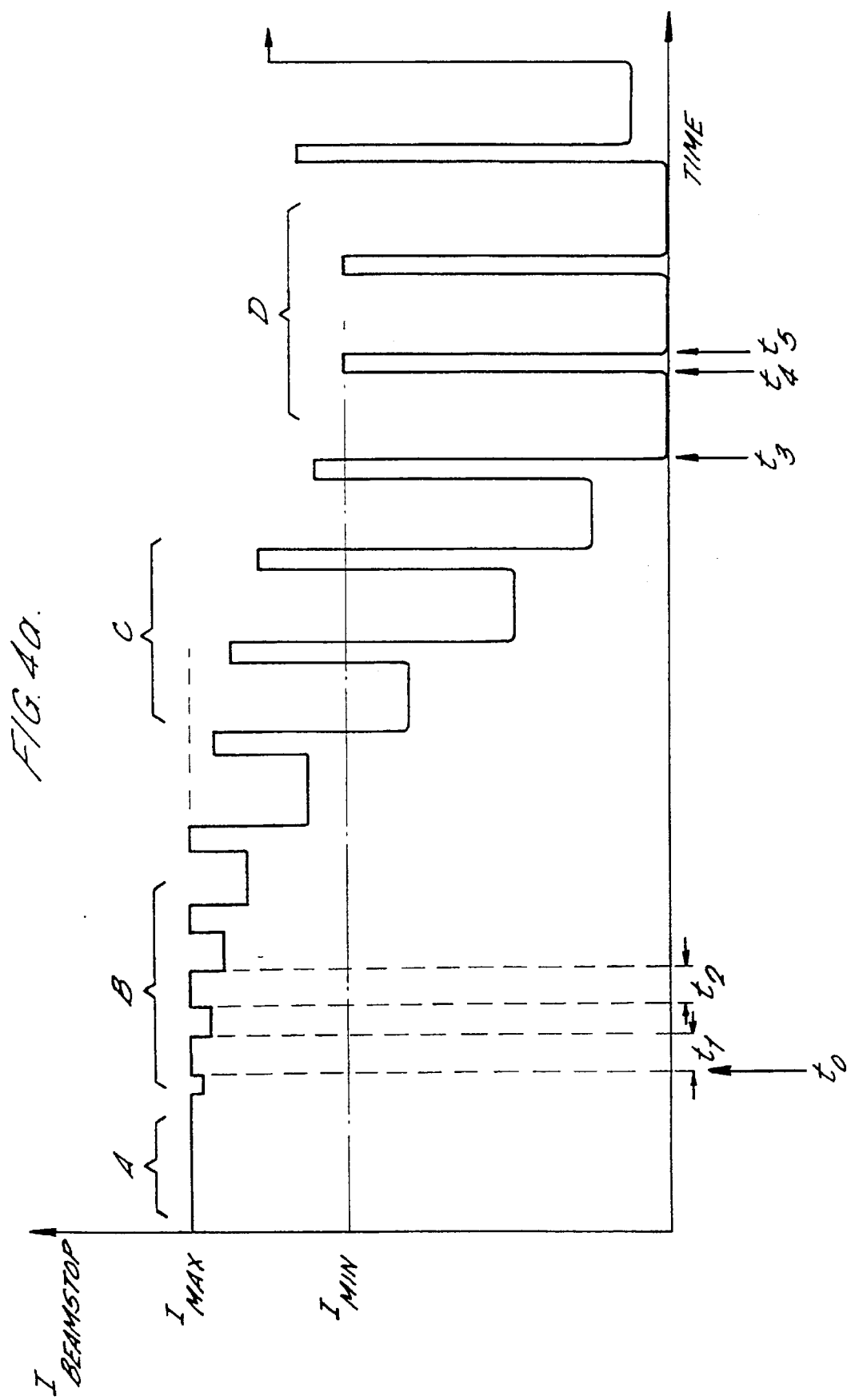

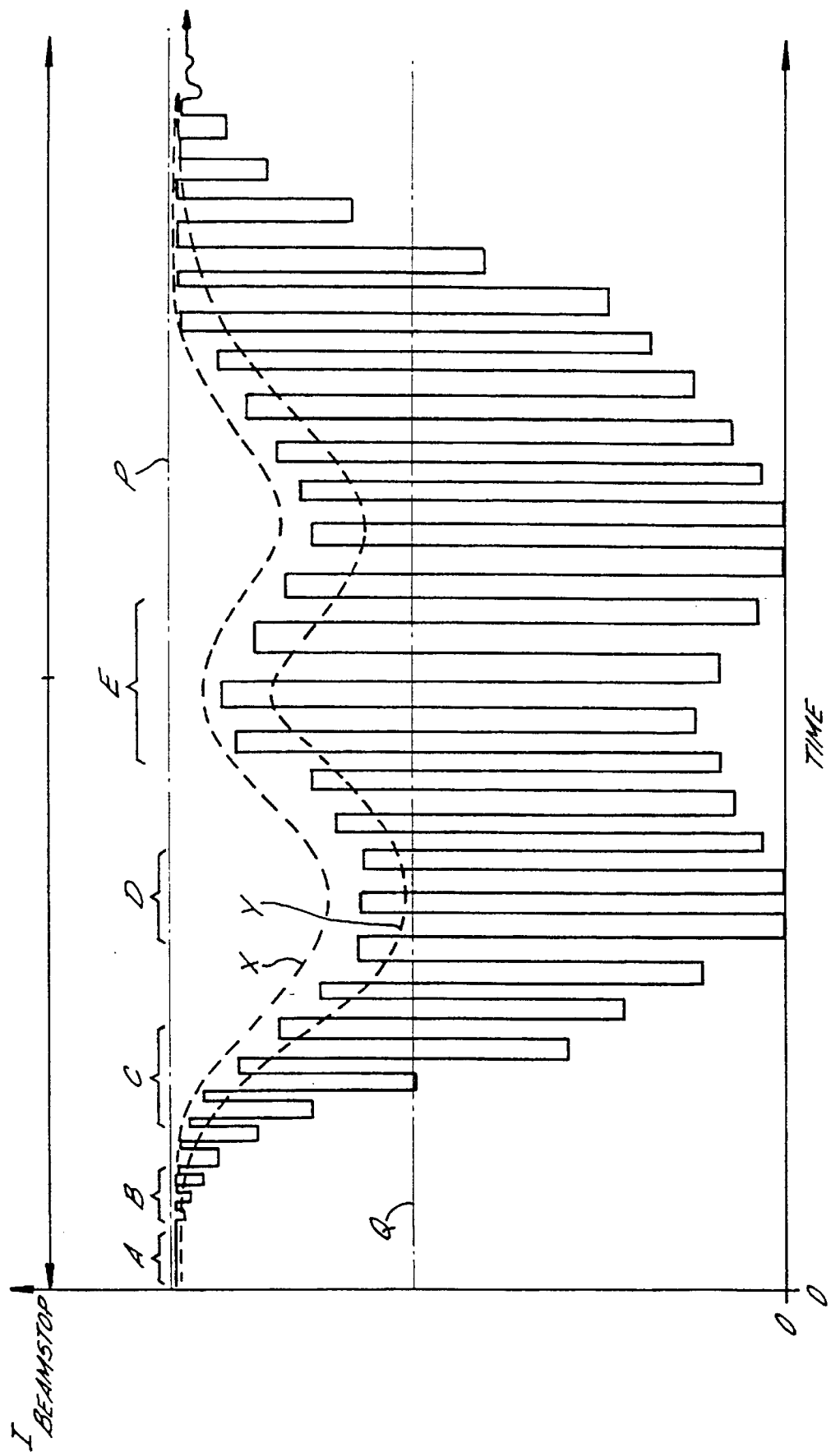

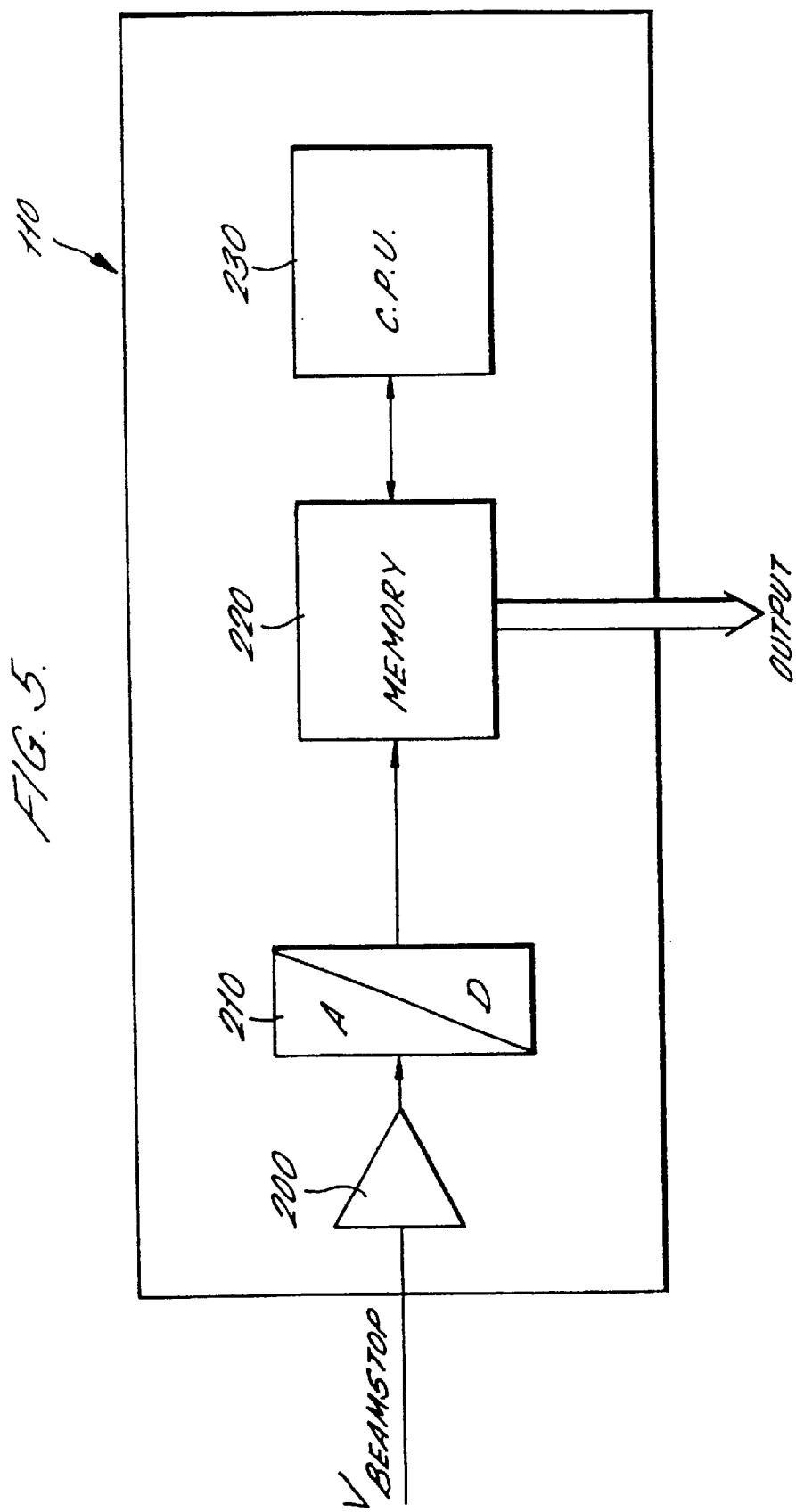

ION IMPLANTATION BEAM MONITOR

This application is the national phase under 35 U.S.C. §371 of PCT International Application No. PCT/GB99/02228 which has an International filing date of Jul. 12, 1999, which designated the United States of America.

This application claims priority under 35 U.S.C. §119 of United Kingdom Application No. 9815921.3, which has a filing date of Jul. 21, 1998, in accordance with 37 C.F.R. §1.55(1)(ii) and which was identified in accordance with the regulations under the Patent Cooperation Treaty as a priority document to PCT International Application No. PCT/GB99/02228 from which this application is derived.

BACKGROUND OF THE INVENTION

This invention relates to an ion implantation beam monitor, in particular for monitoring an ion beam in an ion implanter which implants ions into substrates such as semiconductor wafers.

Semiconductor devices are typically formed from a semiconductor substrate material into which atoms or molecules of selected dopants have been implanted or defused. The dopant particles produce regions in the semiconductor substrate having varying conductivity. By selecting appropriate dopant materials, the majority charge carrier may be locally altered within the substrate.

One preferred technique for adding dopant materials to semiconductor substrates uses ion implantation. This technique minimises the size of the device features created by the dopants within the substrate, reducing the overall size of the semiconductor device itself and increasing operational speed.

The principles of operation of an ion implantation apparatus will be familiar to those skilled in the art. Briefly, a plasma generates positive ions of the selective dopant material in an ion source. The ion source ejects the required positively charged ions, which are accelerated by application of an acceleration potential through a magnetic field. The magnetic field is generated by a mass selection arrangement which deflects the ejected ions around a curved path. The radius of curvature of the flight path of the ions is dependent upon the mass/charge ratio of the individual ions. The exit of the mass selection arrangement has a slit within it so that only ions having a predetermined mass/charge ratio can exit the mass selection arrangement.

Those ions exiting the mass selection arrangement impinge upon a semiconductor substrate to be doped. Typically, this substrate will have previously been patterned with photo resist so that only selected regions are doped. Usually, the ions are decelerated after leaving the mass selection arrangement by a further, adjustable high voltage, to allow the final velocity (and hence, the penetration depth into the wafer) of the ions to be chosen.

Frequently, the cross-sectional area of the ion beam at the substrate is less than that of the substrate. This necessitates scanning of either the substrate relative to a fixed direction ion beam or scanning the ion beam across a fixed substrate. In practice, it is preferable to scan the substrate while maintaining the ion beam in a fixed direction, in a manner described below.

FIGS. 1a and 1b show a typical substrate holder 10 looking along the lines of ions exiting the slit in the mass selection arrangement. The substrate holder 10 comprises a plurality of substrate supports or paddles 20, onto which substrates to be doped may be affixed. The substrates supports 20 are spaced equidistantly from a central hub 22 by a plurality of spokes 24. Located between two of the spokes is a sheet of solid material known as a flag 32. The purpose of the flag is to allow indexing of the substrates, as will be described in more detail below.

The central hub 22 is connected to a drive 26 by a shaft 28. The drive 26, which may for example be an electric motor, drives the shaft 28 such that the hub 22 is caused to move reciprocally in the manner of an inverted pendulum. Referring to FIG. 1a, this motion is indicated by the arrows AA'.

In addition to its reciprocal motion, the hub is also rotated about an axis perpendicular to it, as indicated by the second arrow B in FIG. 1a. Thus, the ion beam, which normally follows a fixed, linear trajectory once it exits the mass selection apparatus, is caused to scan across the plurality of substrates held on the substrate supports 20 by the reciprocating and rotating movement of the substrate holder 10. The motion of the substrate holder relative to the ion beam creates a series of curvilinear "stripes" across each substrate.

It will be understood that the reciprocal movement of the substrate holder described herein is but one exemplary method of scanning the ion beam relative to the substrates. For example, the substrate holder may be moved linearly in the vertical plane instead, or in a number of other ways.

In order to ensure that each substrate is doped substantially uniformly across its face, it is useful that the ion beam striking the substrates be monitored. If irregularities or drop-outs in the beam occur (due, for example, to sparking in the high voltage supply that accelerates the ions), then the substrate will be doped non-uniformly. One technique used to carry out such monitoring employs a beam stop, arranged downstream of the ion beam. Such a beam stop is also shown schematically in FIGS. 1a and 1b.

The beam stop 30 includes a Faraday type current detector 40 which may, for example, be a Faraday cup or bucket. The principles of such a device are well-known. Briefly, the centre of the ion beam is directed toward the Faraday type current detector 40, which absorbs ions from the ion beam impinging upon it. An ion beam current is measured by ancillary circuitry 50, which calculates the current from the accumulated charge in the Faraday type detector 40. As the reciprocal movement of the shaft 28 supporting the hub 22 causes the substrate holder 10 to pass between the ion beam and the beam stop, the ion beam is absorbed by the substrates rather than the Faraday type detector, and the beam stop current reduces.

Monitoring of the ion beam current has, in the past, been carried out simply by observing the beam stop current during those periods when the Faraday type detector 40 is completely uncovered, i.e. when the shaft 28 of the substrate holder 10 has swung away from the beam stop 30, as shown in FIG. 1a. However, in this approach the ion beam drop-outs described above may well be missed, if they occur as the substrate holder moves in front of the Faraday type detector.

SUMMARY OF THE INVENTION

It is an object of the present invention to provide an improved ion implantation beam monitor that alleviates the problems with the prior art.

According to a first aspect of the present invention, there is provided an ion implantation apparatus comprising an ion beam source, a substrate holder downstream of the ion beam source, the substrate holder supporting a plurality of radially spaced substrates, scanning means for scanning the substrates relative to the ion beam, a beam stop, downstream of the substrate holder, for capturing ions in the ion beam not striking the substrate holder, and for generating a beam stop current therefrom, and sampling means, for taking a plurality of samples of the beam stop current which is generated as the ion beam passes between the radially spaced substrates, such that the ion beam current may be monitored over a plurality of discrete time periods.

The gap between substrates is thus used to obtain information about the ion beam continuity. By sampling the beam stop current each time the ion beam passes between two adjacent substrates, for example, information can be obtained on the ion dose received by these two substrates. This in turn can assist in identifying a particular substrate which has not received a correct dose, due to drop-outs in the ion beam, for example.

According to a second aspect of the present invention, there is provided an ion implantation apparatus comprising an ion beam source, a substrate holder, downstream of the ion beam source, scanning means for scanning the substrate holder relative to the ion beam at a predetermined scan rate, a beam stop, downstream of the substrate holder, for capturing ions in the ion beam not striking the substrate holder, and for generating a beam stop current therefrom, timing means, for measuring the time difference between a first time, at which the beam stop current first reduces from a maximum value as the substrate holder passes in front of the ion beam, and a second time, at which the beam stop current first reaches a minimum value as the substrate holder passes in front of the ion beam, and output means for outputting the product of the time difference and the predetermined scan rate, the output thereby being representative of the width of the ion beam perpendicular to the direction of travel of said ion beam.

The beam stop current rises and falls as a series of pulses, when the substrates periodically cut the ion beam. Each pulse has a maximum as the ion beam passes between adjacent substrates and a minimum as the ion beam is absorbed by the substrates. Measuring the time between pulses can provide an indication of the ion beam width.

In a third aspect of the present invention, there is provided an ion implantation apparatus comprising an ion beam source, a substrate holder, downstream of the ion beam source, the substrate holder comprising a rotatable wheel including a plurality of substrates supported upon spokes spaced radially around the wheel, a beam stop, downstream of the substrate holder, for capturing ions in the ion beam not striking the substrate holder, and for generating a beam stop current therefrom, scanning means for scanning the substrates relative to the ion beam such that the beam stop current comprises a series of is pulses, each pulse defining an upper beam stop current, where the ion beam passes between the substrates or spokes, and a lower beam stop current, where the ion beam passes across the substrates or spokes, timing means for timing the pulse width of a pulse having a minimum upper beam stop current, and output means for outputting the product of the pulse width and the scan velocity, the output being representative of the height of the ion beam perpendicular to the direction of travel of said ion beam.

The width of the pulse produced as the ion beam passes between two adjacent substrates can thus be used to measure the ion beam height.

The invention also extends to a method of monitoring an ion beam in an ion implantation apparatus comprising generating an ion beam, scanning a substrate holder relative to the ion beam, the substrate holder supporting a plurality of radially spaced substrates, capturing, in a beam stop, ions in the ion beam not striking the substrate holder, generating a beam stop current from the ions captured in the beam stop, and taking samples of the beam stop current generated as the ion beam passes between the radially spaced substrates, such that the ion beam current may be monitored over a plurality of discrete time periods.

Further details and advantages of the invention are set out in the dependent claims appended hereto.

BRIEF DESCRIPTION OF THE DRAWINGS

The invention may be put into practice in a number of ways, one of which will be described by way of example only, and with reference to the accompanying drawings in which:

FIG. 2 shows part of an ion implantation apparatus including a beam stop current monitor having a digital signal processor (DSP);

FIGS. 3a to 3d show part of a substrate holder as it moves across a beam stop;

FIGS. 4a and 4b show the beam stop current as a function of time, as the substrate holder moves across the beam stop;

FIG. 5 shows a schematic block diagram of one embodiment of the DSP in FIG. 2.

DESCRIPTION OF THE INVENTION

Referring first to FIG. 2, a part of an ion implantation apparatus is shown. Ions are generated and accelerated, and passed through a magnetic field to select the desired mass-charge ratio of ions to be implanted. The chosen ions exit a mass selection slit. This part of the ion implantation apparatus will be well known to those skilled in the art and does not form a part of the present invention. Accordingly, the apparatus required to accelerate and mass select the ions is not shown in FIG. 2 for the sake of clarity.

The mass selected ions are directed towards a Faraday-type detector 40 in a beam stop 30. The ions are trapped by the Faraday-type detector.

In order to accelerate the ions, the body of the ion implantation apparatus (referred to collectively as the "flight tube") is at a negative potential relative to the plasma where the ions are generated. In order to maintain electrical neutrality, therefore, the ions trapped by the beam stop 30 must be returned to the flight tube. Thus, a beam stop current is generated between the beam stop 30 and the flight tube (not shown).

Within the current path from the beam stop to the flight tube is situated a current-to-voltage converter 100, which is suitably an active, solid state device. Current-to-voltage converters are in themselves well known, and the manner in which the beam stop current is converted into a voltage does not form a part of the present invention.

The voltage generated by the current-to-voltage converter 100 is fed to a digital signal processor (DSP) 110 which contains an analog-to-digital converter for digitizing the voltage signal $V_{BEAMSTOP}$ from the current-to-voltage converter 100.

Various calculations are carried out on the signal $V_{BEAMSTOP}$ within the DSP 110, to provide information pertaining to beam uniformity and shape. The calculations carried out by the DSP 110 will be described in more detail below.

The results of the calculations carried out may be displayed upon a screen 130.

Figure 3A:
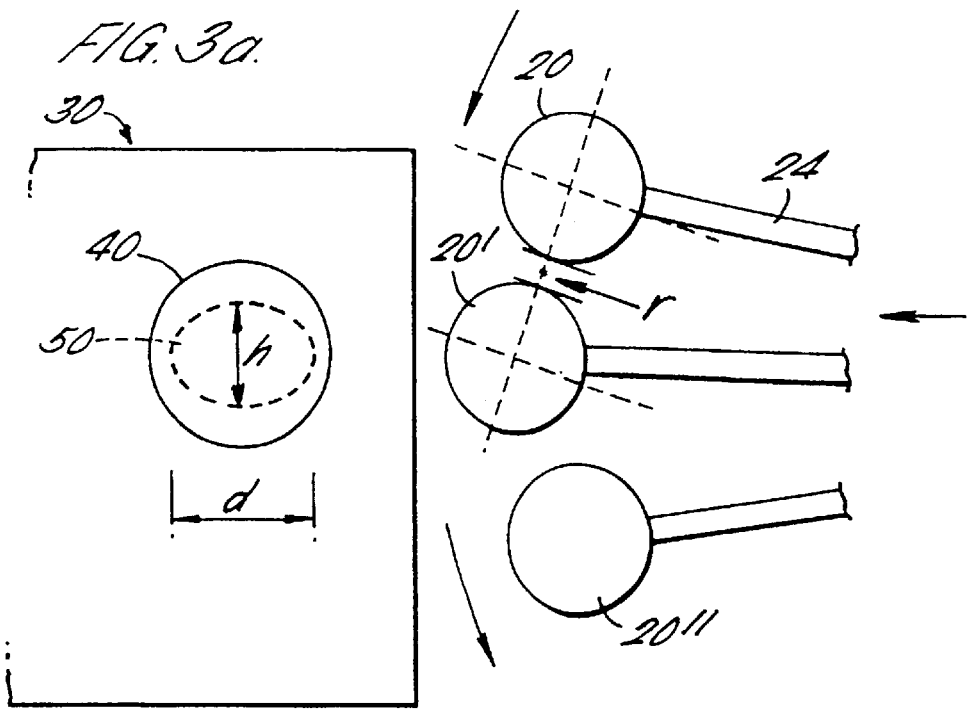

Referring now to FIGS. 3a to 3d, the movement of the substrate holder relative to the ion beam and beam stop is shown in more detail. The beam stop current thus generated is shown in FIGS. 4a and 4b. In FIG. 3a, some of the substrate supports 20 of the sample holder 10 are shown. For clarity, only three substrate supports 20, and a part of the arms connecting the substrate supports to the hub 22, are shown. It will be appreciated, however, that in reality there will be substantially more substrate supports on the substrate holder 10 to each of which is affixed a substrate. For example, the substrate holder may hold 17 substrates, each approximately 200 mm (0.2 m) in diameter.

As seen from FIG. 3a, the substrates on the substrate supports 20 are rotating, in this example, in an anti-clockwise direction. In addition, the hub 22 of the substrate holder 10 (FIG. 2) is at its furthest point of travel away from the beam stop 30. The ion beam, shown in dotted lines at 50 in FIG. 3a, is directed towards the Faraday-type current detector 40 in the beam stop 30. Because of the location of the hub relative to the beam stop, the ion beam enters the Faraday-type detector 40 without being intercepted by the substrates. Thus, the beam stop current $I_{BEAMSTOP}$ is at this point substantially a constant value which defines a maximum beam stop current $I_{MAX}$. This region is indicated at A in FIG. 4a.

Figure 3B:
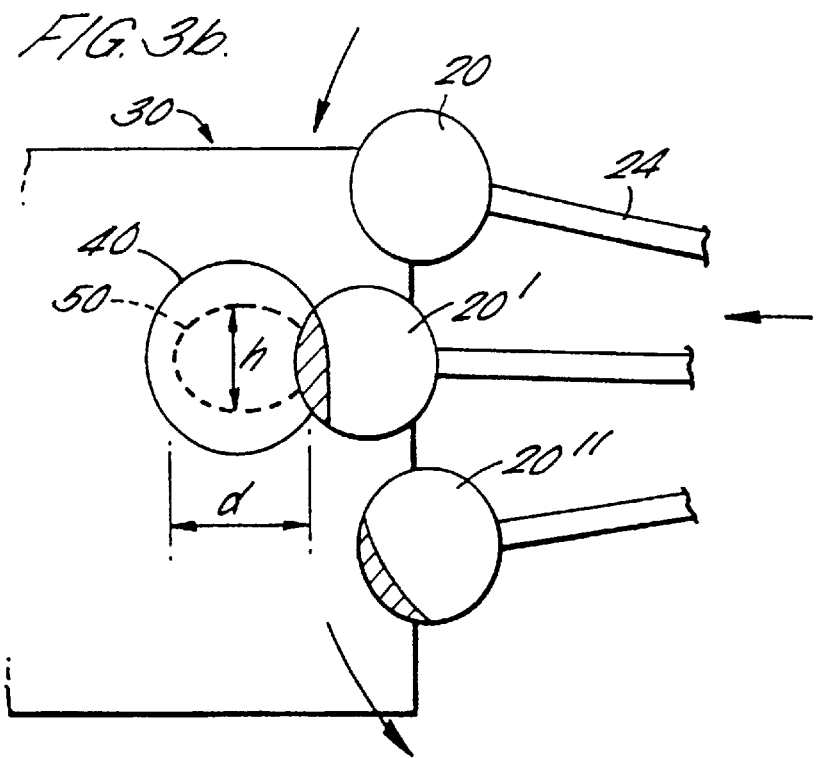

Turning next to FIG. 3b, a part of the substrate holder 10 of FIG. 2 is again shown. The hub 22 of the substrate holder 10 has moved towards the beam stop 30 due to the reciprocating motion of the sample holder 10. Part of the ion beam 50 is now absorbed by the left-hand edge of each substrate on substrate supports 20, 20' as they pass in front of the Faraday-type detector 40. As this occurs, the beam stop current reduces, as a proportion of the ion beam is implanted into the substrates rather than entering the Faraday-type detector 40.

At this stage, however, the ion beam 50 is only partially obscured as the substrates pass in front of the detector 40. For example, between the substrates on substrate supports 20 and 20' there is a gap. After substrate support 20' has passed in front of the detector 40, but before the next substrate support 20 passes in front of the detector 40, all of the ion beam enters the detector 40, and the beam stop current returns, briefly, to its maximum value $I_{MAX}$. The beam stop current thus becomes a series of negative-going pulses, as shown at B in FIG. 4a. Of course, as the hub is continually moving towards the beam stop 30 as the substrates rotate, the percentage of the ion beam 50 which is incident upon each successive substrate will increase, and hence the depth of each successive pulse will increase. Furthermore, as the substrates are, in this preferred embodiment, circular, and rotating at a constant angular velocity around the hub 22, the time over which the beam stop current returns to a maximum will reduce as the substrate holder continues to move towards the beam stop 30. This may be seen in FIG. 4a, where the first indicated pulse width, $t_1$ is greater than the next successive pulse width, $t_2$.

Referring now to FIG. 3c, the three substrates on substrate supports 20, 20', 20'' (which are a part of the substrate holder 10) continue to move leftwards due to the reciprocating motion of the hub 22 to which they are attached. The majority of the ion beam is now absorbed by each substrate as it passes in front of the beam, and the depth of the pulses in the beam stop current increases. The height, h, of the ion beam (see FIGS. 3a, 3b and 3d) is typically greater than the minimum distance between the substrates, r (see FIG. 3a), and the beam stop current does not normally therefore return to its maximum value $I_{MAX}$ at any point during this part of the cycle. This may be seen in the region marked C in FIG. 4a.

The rotating substrates continue moving to the left, and at a certain point the ion beam 50 is wholly absorbed by the substrates as they pass in front of it. Therefore, the beam stop current becomes a series of pulses having a minimum peak current $I_{MIN}$ (where the minimum distance, r, between the substrates governs the amount of ions reaching the detector 40), and a trough current which is zero, when each substrate completely absorbs the ion beam. This region is shown at D in FIG. 4a.

The substrate holder 10 continues to move leftwards, i.e. towards the beam stop 30, until all of the substrates have passed across the full width d of the ion beam 50. Referring to FIG. 3d, it will be seen that, at this point, the ion beam is no longer absorbed by the substrates on substrate supports 20, 20' and 20''. Thus, the beam stop current increases again. The beam stop current is, however, still a series of pulses, as the beam is periodically absorbed by the shafts 24 which hold the substrate supports to the hub 22.

Figure 1A:
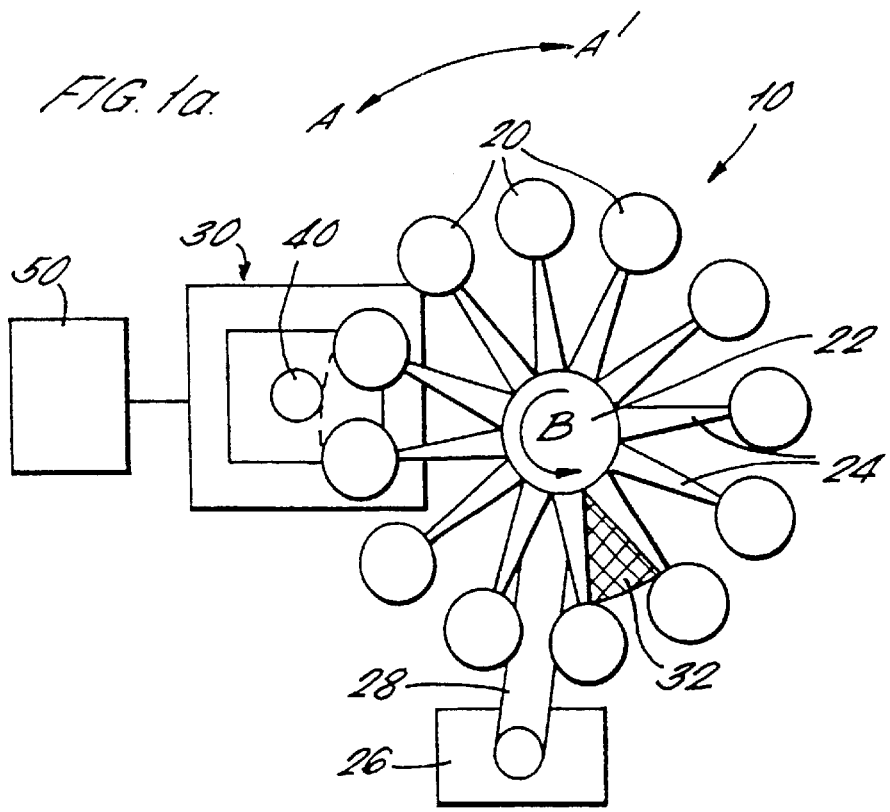
FIGS. 1a and 1b show front views of a substrate holder and beam stop.
Figure 1B:
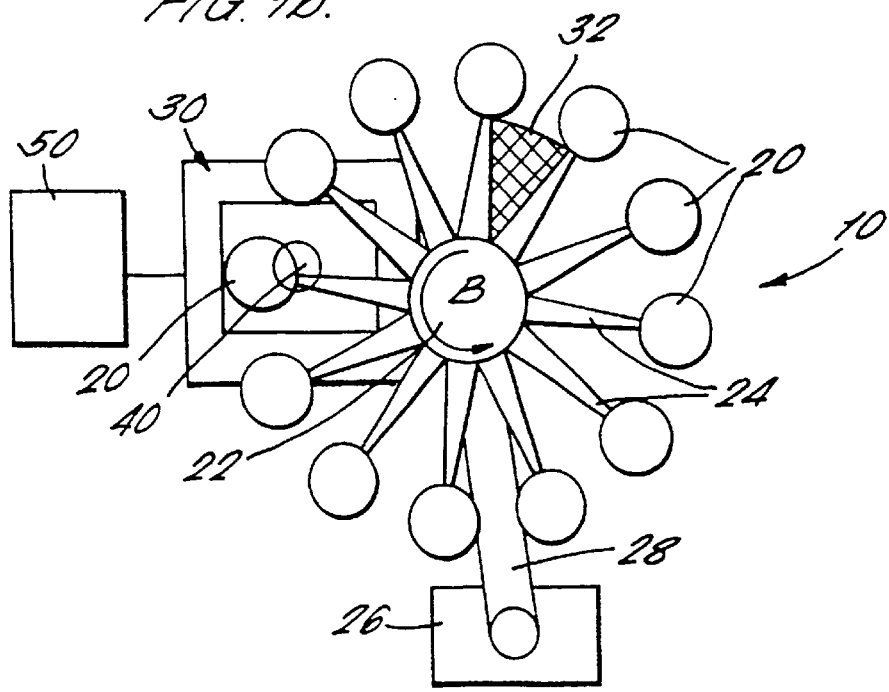

As may be seen in FIGS. 1a and 1b, the spoked substrate holder 10 may have a flag 32 between two adjacent spokes. The flag extends only as far as the inner radius of the adjacent substrates, however. When the flag 32 is present, therefore, there will be a "drop-out" in the beam stop current once per revolution, as the ion beam is absorbed by the flag instead, but only when the ion beam is at or near the position shown in FIG. 3d. This drop-out may be used to index the substrates.

For example, if the substrate holder is rotating counter-clockwise (see FIG. 2), then the substrate immediately next to the flag in the clockwise direction may be labelled "substrate 1". The first current pulse registered after the drop-out will then arise as the ion beam passes through the gap between substrates 1 and 2, substrate 2 being immediately clockwise of substrate 1.

It will be understood that a flag is not essential for indexing, and other known techniques may be employed.

FIG. 4b shows the beam stop current over one full cycle of the substrate holder 10 as it moves from a point where the hub 22 is at its rightmost point (i.e., at its furthest point from the beam stop 30 as shown in FIG. 3a), to its leftmost point of travel, where the hub 22 is at its closest point to the beam stop 30 (FIG. 3d), and then back again to its furthest rightmost point. In the following description, this will be referred to as one scan cycle.

It will be seen that the beam stop current is a modulated wave having a maximum amplitude when the substrate holder 10 is around its rightmost point of travel, a minimum amplitude as the substrates pass directly in front of the ion beam 50, and a subsidiary maximum as the ion beam 50 is absorbed only by the substrate support shafts 24. The drop-outs referred to above and caused by the flag 32 are not shown in FIGS. 4a and 4b, for the sake of clarity. Such drop-outs would, of course, occur only in the region marked "E" in FIG. 4b, however.

FIG. 5 is a block diagram showing the circuitry of the DSP 110 (FIG. 2) which is used to generate a dose uniformity map of each substrate on the substrate holder 10. The DSP 110 takes, as an input, a voltage signal $V_{BEAMSTOP}$ which is representative of the beam stop current. The signal is buffered by a buffer 200, the output of which is fed to an analogue-to-digital converter 210.

The samples generated by the analogue-to-digital converter are fed to a memory 220 where they are stored in separate addresses. Various calculations can be carried out on the stored samples of the modulated analogue input signal to provide useful information about the ion beam shape and continuity. As shown in FIG. 5, these calculations are suitably carried out by a central processing unit 230 within the DSP 110.

1. Dose Uniformity

A dose uniformity map of each substrate on the substrate holder 10 may be generated from the measured beam stop current.

The substrates are, in the present example, arranged equidistantly around a central hub 22, as previously described. The individual substrates are also equidistantly spaced from each other. Thus, as the substrate holder 10 moves from its rightmost position as shown in FIG. 2, towards the beam stop 30, the substrates 20 cut across the ion beam 50 with a characteristic frequency. For example, a typical substrate holder 10 might have 17 substrate supports 20, holding 17 substrates, and be rotated at 1250 rpm. The time between a chosen point on a first substrate on a first substrate support 20' passing a fixed point upon the beam stop 30, and a corresponding point on the next substrate on the next substrate support 20 passing that point upon the beam stop, will in this example then be $(1/17).(1250/60)^{-1}$ seconds=2.8 ms.

The minimum sampling rate required to monitor the ion dose to all of the substrates is therefore one sample for each substrate passing, i.e. $1/(2.8 \times 10^{-3}) = 357$ Hz. It is, however, preferable to sample at a much faster rate than that, as in other applications it is desirable to obtain intrapulse, as well as interpulse, information. For example, the analogue-to-digital converter may sample at or around 1 kHz or even higher. For example, a sampling rate of 3.57 kHz equates to about 10 samples taken between similar points on adjacent substrates.

In the preferred embodiment, batches of samples are grouped together in discrete 2.8 ms intervals. For example, an encoder (not shown) on the hub 22 can be arranged to send a signal to the DSP 17 times per revolution to reset the sampling at 2.8 ms intervals. This ensures that each batch of samples equates to the beam stop current between equivalent points on adjacent substrates.

Once a plurality of samples have been stored in the memory 220, the processor 230 generates a digital word representative of the integrated total of the beam stop current between similar points on adjacent substrates. (i.e. The sum of samples in each batch described above). The location of these points upon the substrates is not critical and will of course depend upon the angle of the hub at which the DSP is reset by the encoder, for example. However, it is convenient to sum from the leading (or trailing) edge of one substrate to the leading (or trailing) edge of the next. When the integrated total of one such word is zero, this is indicative of the ion beam having been absorbed by the flag 32. The processor may then index each of the following substrates accordingly.

The processor compares each word generated with the previous word generated. If the difference is greater than a first magnitude pre-loaded into the DSP 110, then a flag bit of zero is added to the generated word. If, on the other hand, the difference between two consecutive generated words is less than the pre-loaded first magnitude, the generated word does not have a flag bit added. Instead the absolute magnitude of the generated word is compared with a first pre-loaded word. The pre-loaded word is representative of a minimum beam stop current which in turn represents the minimum substrate dose acceptable. If the generated word is less than the first pre-loaded word, then a flag bit of zero is added to the generated word.

Next, the generated word is compared with a second pre-loaded word, representative of a maximum beam stop current (integrated over one substrate). If the generated word is larger than the second pre-loaded word, then a flag bit of zero is added to the generated word.

Otherwise, a flag bit of one is added to the generated word.

After comparison, each generated word (having a flag bit of one or zero) is stored in a separate address in the memory 220.

It will be appreciated from FIG. 4b in particular that the maximum beam stop current reduces to a value below $I_{max}$ over part of the scan cycle, because the ion beam height, h, is larger than the separation between successive substrate holders. Thus the first and second pre-loaded words in the processor 230 may be dynamically variable. This provides upper and lower limits, shown as the two dotted lines X and Y in FIG. 4b, which are varied with time. In this way, the upper and lower absolute beam stop current values, indicative of an acceptable implantation dose, are varied to take into account the change in the maximum beam stop current throughout each scan cycle.

Alternatively, if coarser monitoring of the absolute beam stop current is acceptable, two fixed limits (shown as dash-dot lines P and Q in FIG. 4a) can be employed by using fixed first and second pre-loaded words.

The procedure carried out by the processor 230 and described above may be carried out in real time. That is, each generated word may be derived from the output of the analogue-to-digital converter 210, comparisons may be made, each generated word may be flagged accordingly and then stored again, whilst further samples are being taken by the analogue-to-digital converter 210. Alternatively, the processor may wait until the end of each scan cycle, or even completion of the whole substrate doping procedure (which may include several scan cycles) before carrying out the various calculations.

Typically, the substrate holder rotates 200 times per scan cycle. Thus, at the end of each scan cycle, the memory will contain 3400 generated words, each having a flag bit of one or zero. The DSP 110 outputs the contents of the memory 220 to a screen 130 (FIG. 2). Table 1 below shows the content of the memory 220 after three scan cycles of the substrate holder, in the form it is read out to the screen. The generated words are matched to their respective substrate number, and the number of generated words for a given substrate which have a flag bit of one are indicated. Thus, the table provides information of the number of times (out of a maximum of 200) per scan cycle in which a particular substrate has been adequately dosed. As shown in FIG. 2, an alarm 130 may also be triggered by the processor 230 if less than a pre-determined number of "stripes" on a given substrate are acceptable (that is, have a flag bit of one).

TABLE 1

| Substrate # | Scan 1 | Scan 2 | Scan 3 |
|---|---|---|---|
| 1 | 200 | 200 | 200 |
| 2 | 200 | 200 | 200 |
| 3 | 200 | 190 | 150 |
| 4 | 150 | 180 | 200 |
| 5 | 125 | 200 | 200 |

TABLE 1-continued

| Substrate # | Scan 1 | Scan 2 | Scan 3 |
|---|---|---|---|
| 6 | 125 | 170 | 200 |
| 7 | 150 | 160 | 200 |
| 8 | 200 | 200 | 200 |
| 9 | 200 | 200 | 200 |
| 10 | 200 | 100 | 150 |
| 11 | 150 | 80 | 150 |
| 12 | 150 | 200 | 100 |
| 13 | 100 | 200 | 100 |
| 14 | 100 | 200 | 200 |
| 15 | 200 | 200 | 200 |
| 16 | 200 | 100 | 200 |
| 17 | 200 | 100 | 200 |

Figure 6:
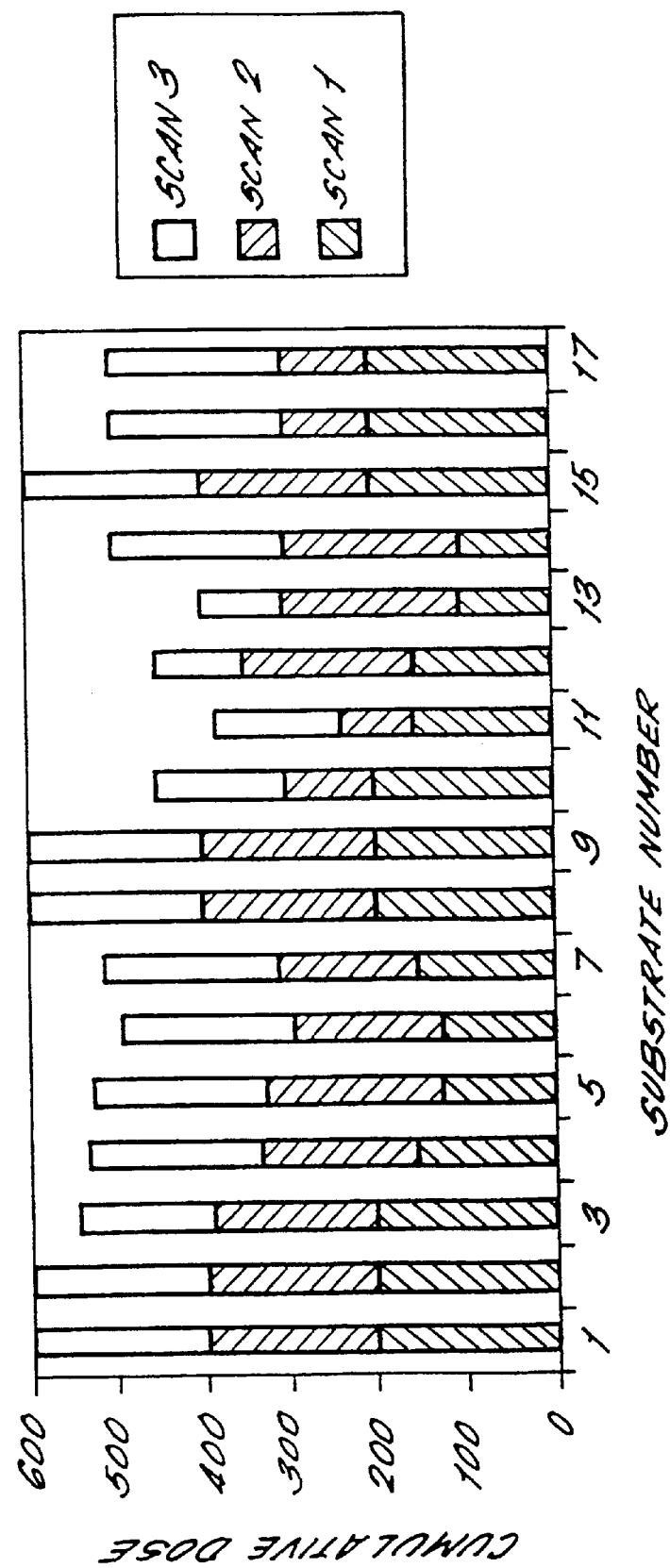
FIG. 6 shows one output of the monitor of FIG. 2.

The information is presented on the screen 130 in the form of bar charts (see FIG. 6) which allow ready comparison of the quantity of ions incident upon each substrate. This in turn permits a decision to be made regarding the quality of each substrate. Furthermore, the position of each implanted "stripe" of ions can be defined from knowing the scan position and the substrate number.

As an example, if there is a drop-out in the ion beam due to arcing in the high voltage supply that accelerates the ions, the beam current, and beam stop current, will fall to zero. The drop-out time typically varies between about 10 ms and 200 ms, i.e. significantly longer than the time taken for one substrate to pass the ion beam.

The measurement of dose uniformity thus allows two important checks to be carried out. Firstly, a real time check of dosing can be made. The total time taken to dope 17 substrates is several minutes, as the substrate holder 10 scans the ion beam several times in each doping procedure. The monitor described above can allow real time analysis of the ion beam uniformity, and thus allows systematic low dosing of one of the substrates, for example, to be recognised early in the procedure—perhaps after only one scan cycle. The operator can then investigate the source of the problem without delay. Furthermore, the total dose to each substrate is known at the end of the cycle, and a decision can be taken whether to reject certain substrates which have not received a full dose.

2. Beam Width Size Check

The width of the beam, d (see FIG. 3a) can also be detected with the digital signal processor 110. Referring once again to FIG. 4a, it is seen that the beam stop current is generally constant over the period A. This corresponds to the part of each scan cycle where the substrates 20 do not cut the ion beam 50, for example as shown in FIG. 3a. Consecutive 2.8 ms periods of the beam stop current signal should therefore be substantially the same during this part of the scan cycle. As the substrate holder 10 moves toward the ion beam 50, however, substrates on substrate supports 20 will start to cut the beam, thus reducing the current measured by the beam stop 30.

As previously, the analogue-to-digital converter preferably 210 generates samples at a rate of several kHz, which are stored in the memory 220. The processor 230 again sums groups of samples in a batch generated over a 2.8 ms period to produce a stream of generated words representative of the integrated beam stop current between similar points on adjacent substrates during one revolution of the substrate holder. The words are stored in different addresses in the memory 220.

Of course, if it is desirable to measure dose uniformity as well as beam width, then the words generated after comparison, as described above, may be suitably used, the flag bits being ignored for calculating beam width.

After one full scan cycle, the processor 230 determines when the beam stop current signal first drops from its substantially constant value $I_{MAX}$ in the region A of FIG. 4a. For example, the processor may identify the first generated word which is less than the previous generated word.

Provided the generated words are stored in a known order, for example at sequential addresses, and the substrate holder rotates and scans at a constant speed, then the time at which the beam stop current first drops below $I_{MAX}$ (labelled $t_0$ in FIG. 4a) may be directly related to the generated word identified.

The processor also identifies that generated word representative of the time when the beam stop current first reaches zero. The beam stop current first reaches zero when the substrates have moved across the ion beam 50 such that the left-hand side of a substrate just covers the left-hand side of the ion beam 50, as viewed in FIGS. 3a–3d. This occurs at a time $t_3$ as shown in FIG. 4a.

The difference (t3–to) is indicative of the time taken for the left edge of the substrates 20 to move from the right-hand edge of the ion beam 50 to the left-hand edge of it, in the arrangement shown in FIGS. 3a–3d. This time difference may be calculated by the processor 230 by counting the number of generated words between the word identified at to and the word identified at t3. From this time difference, the ion beam width, d, can be calculated. If the slow scan speed (i.e., the number of scan cycles per second), expressed in metres per second, is m, then $d=m(t_3-t_0)$.

The above, of course, assumes that the width, d, of the ion beam 50 is smaller than the diameter of each substrate 20, so that there is a point within each scan at which the beam stop current falls to zero. If the beam width d is greater than the substrate diameter, then the DSP 110 will instead need to measure the time taken for the beam stop current signal to reach a minimum, rather than zero. Furthermore, the flag 32 may be used instead. Instead of identifying the generated word which represents that beam stop current pulse which first reaches zero, the processor may instead locate the first generated word representative of a zero magnitude pulse. This in turn represents the first time the ion beam is fully absorbed by the flag 32. Again by counting the number of words between these two identified words, a time difference may be calculated. The beam width, d is then given by $d=m.t_f-D$, where D is the diameter of a substrate 20, and $t_f$ is the time difference between the first current pulse having a magnitude less than $I_{MAX}$ and the first current pulse having zero magnitude.

3. Beam Height Size Check

The height of the beam, h, may also be calculated from the beam stop current signal. The mass selection slit in the ion implantation apparatus is rectangular in shape. Due to mutual repulsion between the (positive) ions in the beam, however, the ion beam expands as it travels from the mass selection slit towards the beam stop 30. Thus, the ion beam 50 is generally elliptical by the time it reaches the beam stop 30, with the major axis, d, being larger than the minor axis, h. The height of the beam, h, can thus be measured by determining the pulse width at "mid-scan".

Referring to FIG. 3a, the beam stop current drops to zero when all of the ion beam is absorbed by a substrate on a substrate holder 20 as it passes in front of the beam. The current will, however, momentarily rise as the ion beam is partially transmitted (assuming h is larger than the separation between adjacent substrate supports 20, 20') through the gap between adjacent substrates. As each substrate is circular in this example, the maximum current in each pulse thus generated will reduce as the substrate holder 10 passes across the beam. A minimum in the total current within each pulse will be reached when the centre of the ion beam 50 is exactly aligned with the mid-point, r, between two adjacent substrates 20, 20', as seen in FIG. 3a.

Mathematically, the minimum beam stop current (in the absence of a flag) will occur at the first turning point in the beam stop current signal, i.e. at the point marked D in FIGS. 4a and 4b.

As previously, the beam stop current is sampled at a rate of several kHz by the analogue-to-digital converter 20 and each sample is stored in the memory 220 of the DSP 110. Digital words are generated which are the sum of batches of samples over 2.8 ms periods, each such generated word representing the integrated total beam stop current from a point on a first substrate to a corresponding point on a second, adjacent substrate during one revolution of the substrate holder 10. These generated words are also stored in the memory 220, at separate addresses.

After a scan cycle has been completed, the processor 230 compares consecutive generated words in the memory 220 to ascertain the turning point in the beam stop current. That is, the processor identifies that generated word which is smaller than either the preceding generated word or the subsequent generated word.

In order to measure the beam height, the width of this pulse must be determined. To do this, the identified digital word is cross-referenced to the raw digital data (also stored in the memory 220, but at a different set of addresses) from which the word is derived. The processor 230 then measures the width of the pulse by counting the number of samples which make up the identified word (i.e. the number of samples taken over the identified 2.8 ms period) and which have zero bits. Those samples having zero bits are obtained from the bottom of the "trough" of the particular pulse to which the identified word relates. This of course assumes that the beam is smaller than the substrate, so that the beam stop current does reach zero at the trough of some pulses.

As shown in FIG. 4a, the pulse width is $(t_5 - t_4)$. The height, h, of the ion beam 50 is then given by $h = R\omega(t_5 - t_4)$, where R is the distance between the centre of a substrate support 20 and the centre of the hub 22, and $\omega$. is the speed of rotation of the substrate holder 10.

Although the digital signal processor 110 described in the above example has been implemented in software, it will be appreciated that the calculations to be performed on the beam stop current could equally be carried out in a hardware implementation.

Furthermore, it will be appreciated that the expressions "beam height" and "beam width" are merely convenient terms to describe dimensions of the ion beam in the particular relative orientations of the beam stop, substrate holder and ion beam shown in the Figures. The meaning of such expressions will differ depending upon the context—for example, if the beam stop were located above the substrate holder 10, and the substrate holder were to scan about a horizontal, rather than a vertical axis, then the terms "width" and "height" would be interchangeable.

What is claimed is:

1. An ion implantation apparatus comprising:
    an ion beam source for producing an ion beam;
    a rotatable substrate holder downstream of the ion beam source, the substrate holder having a plurality of circumferentially spaced substrate supports;
    a two-dimensional mechanical scanner to mechanically scan the substrate supports relative to the ion beam to perform slow scans in a first, slow scanning direction and multiple fast scans for each said slow scan, in a second, fast scanning, direction, the scanner being operative to scan in said second, fast scanning, direction by rotation of said substrate holder;
    a beam stop, downstream of the substrate holder, for capturing ions in the ion beam missing the substrate holder, to generate a beam stop current therefrom,
    a current sampler to produce a plurality of samples of the beam stop current which is generated by the beam ions captured by the beam stop which have passed between adjacent pairs of the circumferentially spaced substrate supports, and
    a processor to receive said plurality of samples and compare said plurality of samples from the beam ions passing between successive said adjacent pairs of substrate supports to monitor the continuity of the ion beam during each rotation of the substrate holder.

2. The apparatus as claimed in claim 1 wherein said substrate holder includes a rotatable wheel having spokes arranged radially around the wheel, said spokes carrying the plurality of circumferentially spaced substrate supports.

3. The apparatus as claimed in claim 2, wherein said substrate holder is rotatable at a constant angular velocity in the fast scanning direction.

4. The apparatus as claimed in claim 3, wherein said substrate supports are arranged equidistantly around the circumference of the substrate holder.

5. The apparatus as claimed in claim 1, wherein said current sampler is arranged to produce a plurality of samples of said beam stop current generated by ions passing between each one of said adjacent pairs of circumferentially spaced substrate supports.

6. The apparatus as claimed in claim 5, wherein said processor is operative to accumulate the plurality of samples of beam stop current for each of said successive adjacent pairs of substrate supports to provide a respective integrated total of beam stop current samples received between similar points on the adjacent substrate supports, and to compare the integrated totals of said successive adjacent pairs.

7. The apparatus as claimed in claim 1, wherein said current scanner scans the substrate supports in the slow scanning direction across a fixed direction ion beam.

8. The apparatus as claimed in claim 1, further comprising a memory for storing the plurality of samples.

9. The apparatus as claimed in claim 1, further comprising a display for displaying the plurality of samples.

10. The apparatus as claimed in claim 1, further comprising a flag located between a predetermined adjacent pair of said circumferentially spaced substrate supports to block the ion beam during a part of each said slow scan, so that during said part of each said slow scan the beam stop current is substantially zero, periodically each said fast scan rotation of the substrate holder, whereby substrates supported by the substrate holder may be uniquely identified.

11. An ion implantation apparatus comprising:
    an ion beam source for producing an ion beam;
    a substrate holder, downstream of the ion beam source;
    a two-dimensional scanner to mechanically scan the substrate holder relative to the ion beam to perform slow scans in a first, slow scanning, direction at a first, slow scan, rate and multiple fast scans, for each said slow scan, in a second, fast scanning, direction;
    a beam stop, downstream of the substrate holder, for capturing ions in the ion beam missing the substrate holder, to generate a beam stop current therefrom;
    said scanner being arranged to perform said slow scans from a start scan position at which the substrate holder does not intersect the ion beam so that the generated beam stop current is continuously a maximum value during said fast scans, a timer responsive to the generated beam stop current during a predetermined said slow scan to determine a first time at which the generated beam stop current first reduces from said maximum value and a second time at which the generated beam stop current first reaches a lowest value for the slow scan, and a processor operative to correlate said first and second times with the slow scan motion to determine the ion beam width in said slow scan direction.

12. The apparatus as claimed in claim 11, wherein said substrate holder includes a rotatable wheel having spokes arranged radially around the wheel, said spokes carrying circumferentially spaced substrate supports.

13. An ion implantation apparatus comprising:

an ion beam source for producing an ion beam;

a substrate holder, downstream of the ion beam source, the substrate holder including a rotatable wheel having a plurality of spokes arranged radially around the wheel, said spokes carrying circumferentially spaced substrate supports;

a beam stop, downstream of the substrate holder, for capturing ions in the ion beam missing the substrate holder, and to generate a beam stop current therefrom;

a two-dimensional scanner to mechanically scan the substrate supports relative to the ion beam to perform slow scans in a first, slow scanning, direction and multiple fast scans, for each said slow scan, in a second, fast scanning, direction at a fast scan rate, the scanner being operative to scan in said second, fast scanning, direction by rotation of said wheel;

wherein during each said slow scan, the beam stop current includes a series of pulses, each pulse defining a pulse maximum beam stop current, where the ion beam passes between adjacent said substrate holders or spokes, and a lower beam stop current, where the ion beam passes across the substrate holders or spokes; and a processor responsive to the generated beam stop current to identify in a predetermined slow scan a pulse of said beam stop current which defines a pulse maximum beam stop current of a lowest value in said slow scan, said processor including a timer to determine a duration of said identified pulse and being further operative to correlate said pulse duration with said fast scan rate to determine the ion beam height in said fast scan direction.

14. A method of monitoring an ion beam in an ion implantation apparatus comprising:

generating an ion beam;

mechanically scanning a substrate holder in a first, slow scanning, direction and in a second, fast scanning, direction relative to the ion beam, the substrate holder supporting a plurality of circumferentially spaced substrates;

capturing, in a beam stop, ions in the ion beam missing the substrate holder;

generating a beam stop current from the ions captured in the beam stop;

obtaining samples of the beam stop current generated by beam ions captured by the beam stop which pass between adjacent pairs of the plurality of circumferentially spaced substrates; and comparing said samples from the beam ions passing between successive said adjacent pairs of substrates to monitor the continuity of the ion beam.

15. The method of claim 14, further comprising the step of:

blocking the ion beam with flag means during a part of each slow scan such that, periodically, the beam stop current is substantially zero, whereby each substrate supported by the substrate holder may be identified.

* * * * *